US008148226B2

(12) United States Patent
Shibata

(10) Patent No.: US 8,148,226 B2

(45) Date of Patent: Apr. 3, 2012

(54) METHOD OF FABRICATING SEMICONDUCTOR DEVICE

(75) Inventor: Mayumi Shibata, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/009,251

(22) Filed: Jan. 19, 2011

(65) Prior Publication Data

US 2011/0207278 A1 Aug. 25, 2011

(30) Foreign Application Priority Data

Feb. 19, 2010 (JP) ................................ 2010-035402

(51) Int. Cl.
*H01L 21/8236* (2006.01)

(52) U.S. Cl. ................................ 438/277; 257/E21.631

(58) Field of Classification Search .................. 438/277; 257/E21.631

See application file for complete search history.

(56) References Cited

U.S. PATENT DOCUMENTS 5,471,073 A * 11/1995 Kohno ........................ 257/108

FOREIGN PATENT DOCUMENTS

JP 11-174405 7/1999

* cited by examiner

*Primary Examiner* — Alexander Ghyka
*Assistant Examiner* — Stanetta Isaac
(74) *Attorney, Agent, or Firm* — Volentine & Whitt, PLLC

(57) ABSTRACT

Disclosed is a method of fabricating a semiconductor device that includes both an enhancement-mode FET and a depletion-mode FET. The method includes forming an opening in a gate electrode for the depletion-mode FET. The opening is located in or in the vicinity of one of the overlapping regions in which the gate electrode extends over active regions. The method further includes ion-implanting dopant impurities into the active regions at an oblique angle using the gate electrode as a mask, thereby to form the doped region that is located under the opening and continuously extending from one of the opposite sides of the gate electrode to the other.

7 Claims, 8 Drawing Sheets

METHOD OF FABRICATING SEMICONDUCTOR DEVICE

BACKGROUND OF THE INVENTION

1. Field of the Invention

The present invention relates to techniques for fabricating a semiconductor device that includes both an enhancement-mode FET (enhancement-mode Field Effect Transistor) and a depletion-mode FET (depletion-mode Field Effect Transistor).

2. Description of the Related Art

Field effect transistors (FETs) such as MOSFETs (Metal-Oxide-Semiconductor Field-Effect Transistors) have been widely used for semiconductor integrated circuits such as drive circuits of liquid crystal displays, and decode circuits of RAMS (Random Access Memories) or ROMs (Read Only Memories). One type of such semiconductor integrated circuits is the integrated circuit in which two types of FETs, enhancement-mode FETs and depletion-mode FETs, are integrated on a semiconductor substrate. For example, Japanese Patent Application Publication No. H11-174405 discloses a drive circuit of a liquid crystal display in which enhancement-mode and depletion-mode FETs are integrated.

The problem with the integration of different types of FETs (i.e., enhancement-mode FETs and depletion-mode FETs) on the semiconductor substrate is that the fabrication process including the integration of different types of FETs becomes more complicated compared with that including integration of the same type of FETs, thus resulting in relatively high cost. An example of such a problem will be described with reference to FIGS. 1-3.

FIG. 1 schematically illustrates a geometrical configuration of gate electrodes 101, 102, 103 and 104 formed over active regions 111, 112 and 113. FIG. 2 schematically illustrates a cross-sectional view of a semiconductor structure as taken along line II-II of FIG. 1. The strip-shaped active regions 111-113 as illustrated in FIG. 1 extend in the X-axis direction. These active regions 111-113 are electrically separated from one another by an isolation structure such as a STI (Shallow Trench Isolation) structure. For example, as illustrated in FIG. 2, the active region 111 can be surrounded by isolation structures 120*a* and 120*b*. The gate electrodes 101-104 are formed over the active regions 111-113, and arranged in the Y-axis direction. An insulating film 123 is interposed between the gate electrodes 101-104 and the active regions 111-113. In the top view of FIG. 1, the insulating film 123 is not shown for the sake of convenience.

FETs will be formed in or in the vicinity of the overlapping regions in which the gate electrodes 101-104 extend over the active regions 111-113. These overlapping regions include the regions 102Da, 102Db and 103Da in or in the vicinity of which depletion-mode FETs will be formed. In these regions 102Da, 102Db and 103Da, doped regions for depletion-mode FETs will be formed directly under the gate electrodes 102, 103 in order to control the threshold voltages of the depletion-mode FETs. FIG. 3 schematically illustrates a cross-sectional view of a semiconductor structure produced by a fabrication step of forming a doped region in the region 102Da in order to control the threshold voltage of a depletion-mode FET. As illustrated in FIG. 3, a resist pattern 130 is formed by photolithography. The resist pattern 130 covers the underlying gate electrodes 101, 103 and 104 for enhancement-mode FETs. This resist pattern 130 also has an opening 130*h* in which the gate electrode 102 for the depletion-mode FET is not covered by the resist pattern 130. Dopant impurities 131 are ion-implanted into the semiconductor substrate 100 using the resist pattern 130 as a mask, thereby to form doped regions 132 for controlling the threshold voltage of the depletion-mode FET. P-type dopants such as Boron (B) for a p-channel FET or n-type dopants such as Arsenic (As) for an n-channel FET can be ion-implanted as the dopant impurities. After the ion-implantation, the resist pattern 130 is removed.

Next, various processes will be performed to fabricate the depletion-mode and enhancement-mode FETs. For example, sidewall spacers (not shown) are formed on the opposite sides of each of the gate electrodes 101, 102, 103 and 104. Dopant impurities are then ion-implanted using as a mask the sidewall spacers, the isolation structures 120*a*, 120*b* and the gate electrodes 101, 102, 103 and 104, thereby to form doped regions (not shown) for LDD (Lightly Doped Drain) regions on the opposite sides of each of the gate electrodes 101, 102, 103 and 104.

The problem with the above fabrication process is that the photolithography as described above is required to form the doped region 132 for controlling the threshold voltage of the depletion-mode FET. This results in high cost compared with other fabrication processes for forming only enhancement-mode FETs on a semiconductor substrate.

In view of the foregoing, it is an object of the present invention to provide a method of fabricating a semiconductor device capable of reducing manufacturing cost in forming enhancement-mode and depletion-mode FETs which are integrated on a semiconductor substrate.

SUMMARY OF THE INVENTION

According to an aspect of the invention, a method of fabricating a semiconductor device in which enhancement-mode and depletion-mode FETs are integrated on a semiconductor substrate is provided. The method includes: forming a plurality of active regions in a semiconductor substrate, the active regions being located at a main surface of the semiconductor substrate and electrically separated from one another by an isolation structure; forming a plurality of gate electrodes on the plurality of active regions, each gate electrode extending in an extending direction transverse to the plurality of active regions; forming an opening in a gate electrode for the depletion-mode FET of the plurality of gate electrodes, the opening being located in or in the vicinity of one of overlapping regions in which the gate electrodes extend over the active regions; ion-implanting dopant impurities into the active regions at an oblique angle of incidence relative to a normal line perpendicular to the main surface of the semiconductor substrate, using the gate electrodes as a mask, thereby to form first, second and third doped regions simultaneously in the active regions, the first and second doped regions being located on respective opposite sides of each of the gate electrodes along a gate-length direction of a corresponding one of the gate electrodes, and third doped region being located below the opening and continuously extending from one of the opposite sides of a corresponding one of the gate electrodes to the other; and forming source and drain regions in the active regions, the source and drain regions being located on the respective opposite sides of each of the gate electrodes.

According to the invention, the number of fabrication steps for fabricating the depletion-mode and enhancement-mode FETs on a single semiconductor substrate can be reduced.

DETAILED DESCRIPTION OF THE INVENTION

Figure 1:
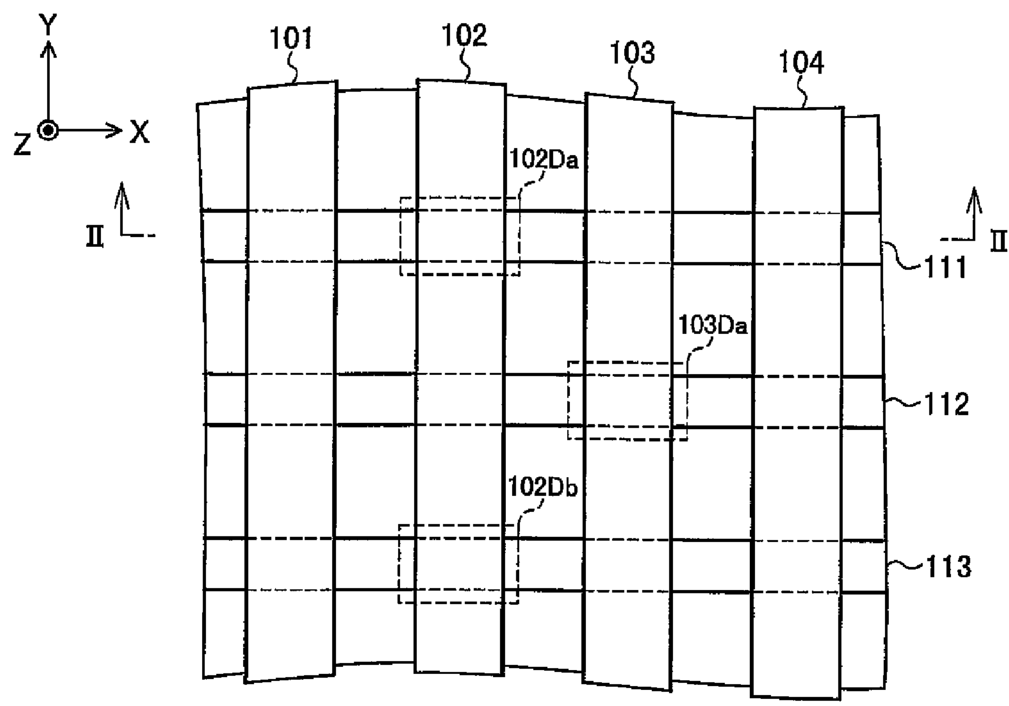
FIG. 1 is a schematic top view illustrating a geometrical configuration of gate electrodes.
Figure 2:
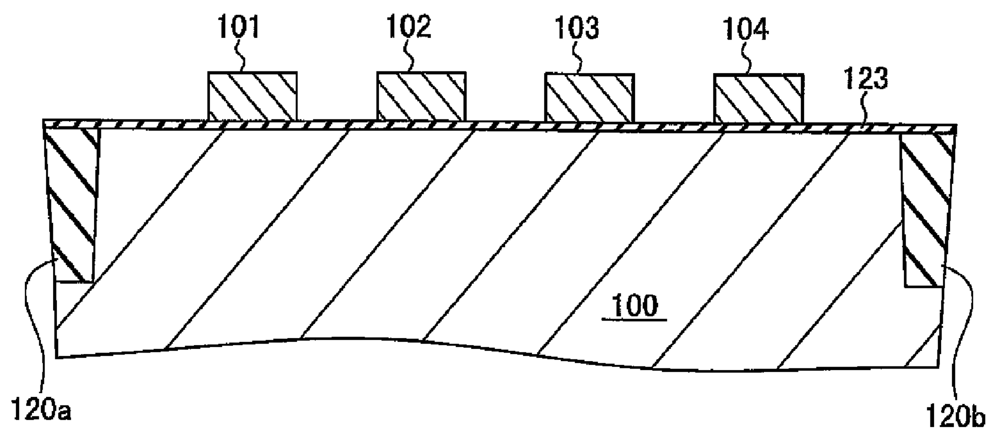
FIG. 2 schematically illustrates a cross-sectional view taken along line II-II of FIG. 1.
Figure 3:
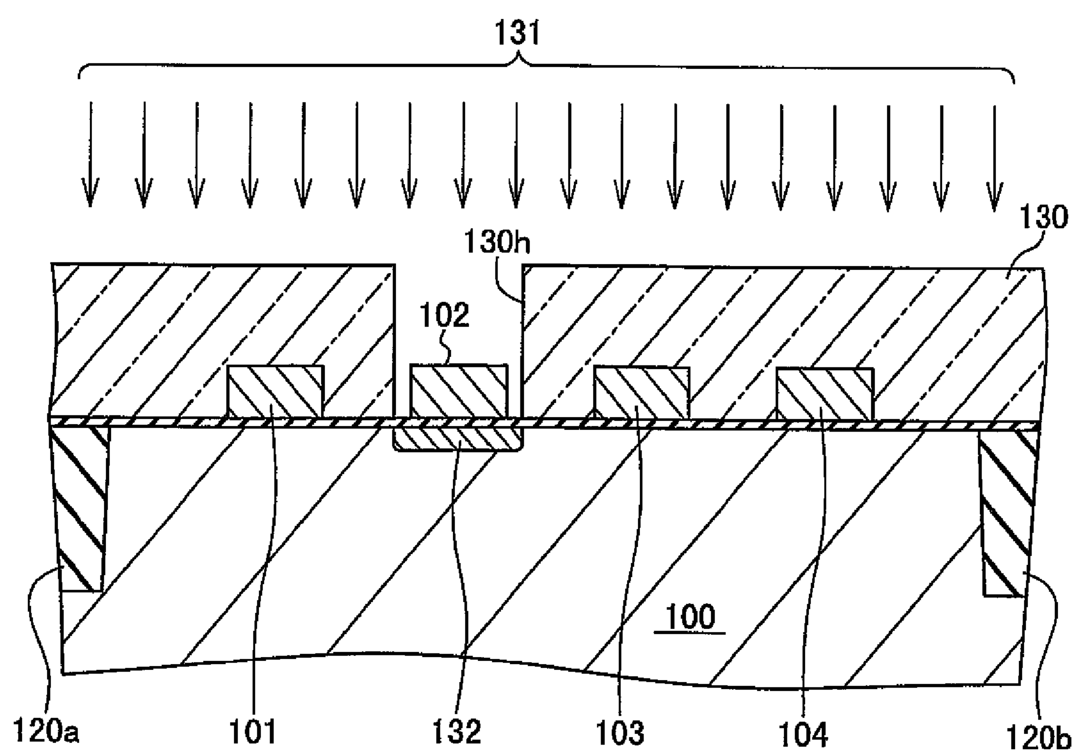
FIG. 3 schematically illustrates a cross-sectional view of a semiconductor structure produced by a fabrication step of forming a doped region in order to control the threshold voltage of a depletion-mode FET.

Embodiments of the invention will now be described with reference to the attached drawings, in which like elements are indicated by like reference characters.

Figure 4:
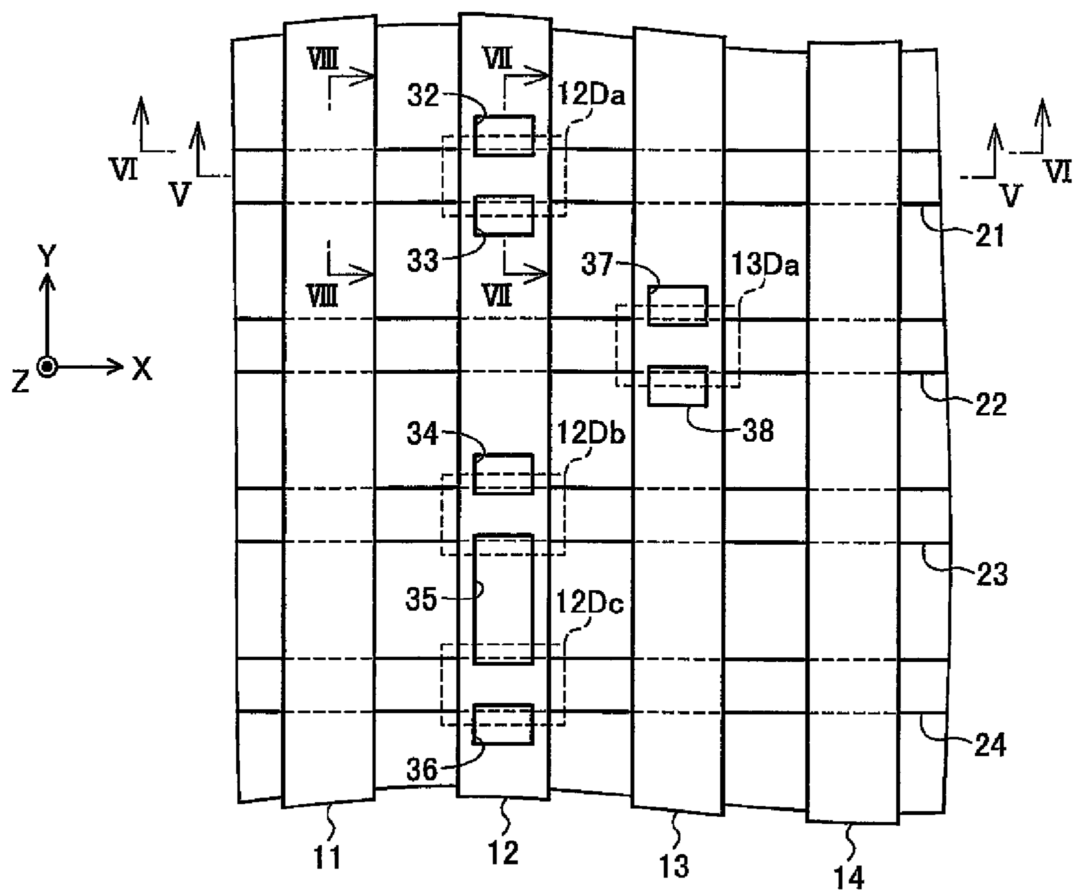
FIG. 4 is a schematic top view illustrating a geometrical configuration of gate electrodes formed on active regions according to an embodiment of the present invention.
Figure 5:
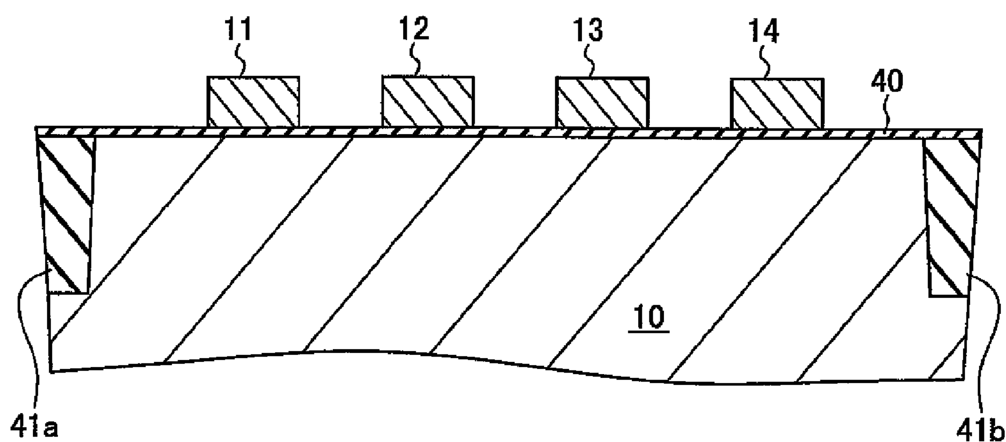
FIG. 5 schematically illustrates a cross-sectional view of the semiconductor structure as taken along line V-V of FIG. 4.
Figure 6:
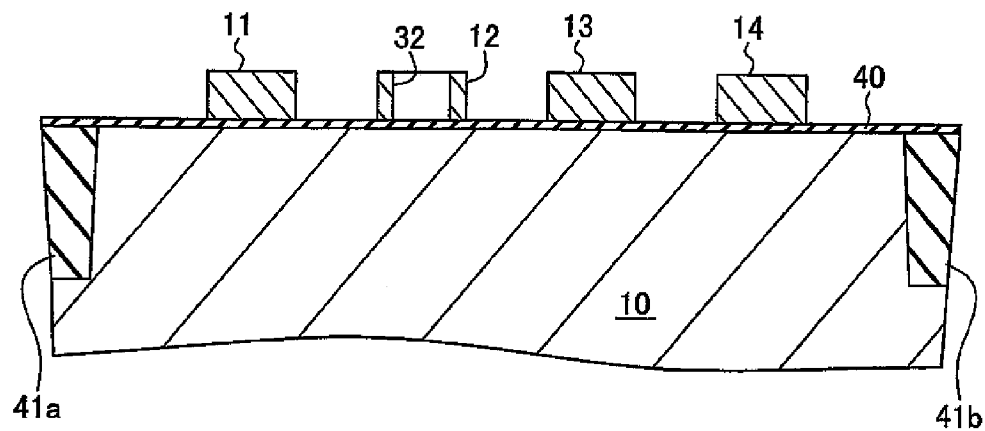
FIG. 6 schematically illustrates a cross-sectional view of the semiconductor structure as taken along line VI-VI of FIG. 4.
Figure 7:
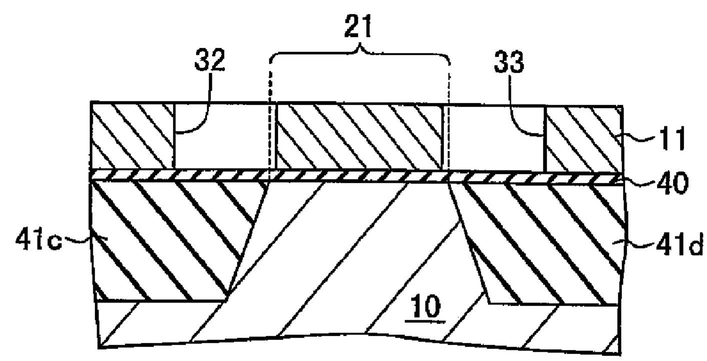
FIG. 7 schematically illustrates a partial cross-sectional view of the semiconductor structure as taken along line VII-VII of FIG. 4.
Figure 8:
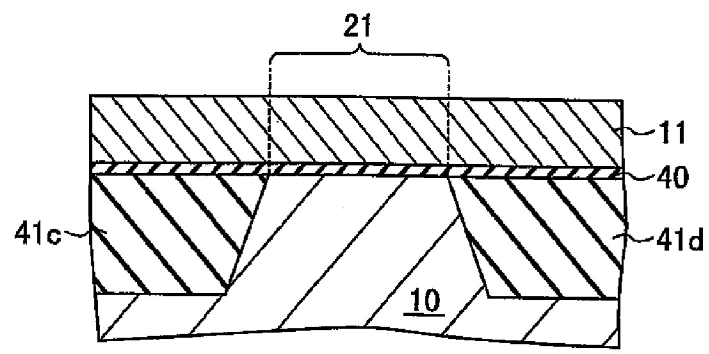
FIG. 8 schematically illustrates a partial cross-sectional view of the semiconductor structure as taken along line VIII-VIII of FIG. 4.

FIGS. 4-10 are schematic views for explaining main steps of a fabrication process of a semiconductor device according to one embodiment of the invention. The fabrication process according to the embodiment will be descried with reference to FIGS. 4-10. FIG. 4 is a schematic view illustrating geometrical configurations of gate electrodes (gate interconnects) 11, 12, 13 and 14 which are formed on active regions 21, 22, 23 and 24. FIG. 5 schematically illustrates a cross-sectional view of the semiconductor structure as taken along line V-V of FIG. 4. FIG. 6 schematically illustrates a cross-sectional view of the semiconductor structure as taken along line VI-VI of FIG. 4. FIG. 7 schematically illustrates a partial cross-sectional view of the semiconductor structure as taken along line VII-VII of FIG. 4. FIG. 8 schematically illustrates a partial cross-sectional view of the semiconductor structure as taken along line VIII-VIII of FIG. 4.

As illustrated in FIG. 4, strip-shaped active regions 21, 22, 23 and 24 are formed in the semiconductor substrate 10 and extend in the X-axis direction. These active regions 21-24 are electrically separated from one another. Each of the active regions 21-24 is surrounded by the isolation structure which is formed in the semiconductor substrate 10. The isolation structure, which includes an embedded insulator such as an oxide in the semiconductor substrate 10, can be provided by a conventional LOCOS (Local Oxidization of Silicon) or STI (Local Oxidization of Silicon) process. As the semiconductor substrate 10, an n-type silicon substrate or a semiconductor substrate having a doped N-type region called N-well can be used for p-channel MOSFETs. Alternatively, an p-type silicon substrate or a semiconductor substrate having a doped P-type region called. P-well can be used for n-channel MOSFETs.

After the formation of the active regions 21-24, the surface of the semiconductor substrate 10 is cleaned or rinsed. An insulating film 40 for a gate insulating layer (gate-dielectric) is then formed on the cleaned surface of the semiconductor substrate 10, as illustrated in FIGS. 5-8. The insulating film 40 can be formed by the thermal oxidization of the surface of the semiconductor substrate 10, or by the deposition of a densified dielectric film including high-k material such as HfSiO and/or HfAlOx.

After the formation of the insulating film 40, a gate electrode material such as metal and/or polycrystalline silicon (polysilicon) is deposited on the insulating film 40 by, for example, chemical vapour deposition (CVD). By a semiconductor lithography process, the deposited gate electrode material is then patterned to form gate electrodes 11-14 having openings or holes 32, 33, 34, 35, 36, 37 and 38. As illustrated in FIG. 4, the extending direction in which the gate electrodes 11-14 extends along the Y-axis direction is transverse to the direction in which the active regions 21-24 extends along the X-axis direction. An enhancement mode or depletion-mode FET will be formed in and in the vicinity of each of the overlapping regions in which the gate electrodes 11-14 extend over the active regions 21-24. The overlapping regions 12Da, 12Db, 12Dc and 13Da can be used for the fabrication of depletion-mode FETs, and the other overlapping regions can be used for the fabrication of enhancement-mode FETs.

In the overlapping region 12Da for the depletion-mode FET, as illustrated in FIG. 7, two openings 32, 33 as a pair are formed on the opposite sides of the active region 21 which is defined by the isolation structures 41*c* and 41*d*, and are arranged in the Y-axis direction. Similarly, in the overlapping region 12Db, two openings 34, 35 as a pair are formed on the opposite sides of the active region 23 and are arranged in the Y-axis direction; in the overlapping region 12Dc, two openings 35, 36 as a pair are formed on the opposite sides of the active region 24 and are arranged in the Y-axis direction; and, in the overlapping region 13Da, two openings 37, 38 as a pair are formed on the opposite sides of the active region 22 and are arranged in the Y-axis direction. These openings 32-38 are rectangular in shape with about 0.5 micro-meters on a side in the X-Y plane, no limitation thereto intended. On the other hand, no opening is formed in the overlapping regions for enhancement-mode FETs. For example, in the overlapping region in which the gate electrode 11 extends over the active region 21, as illustrated in the cross-sectional view of FIG. 8, the gate electrode 11 is continuously formed over the active region 21.

Each of the openings 32-38 has a depth that starts at the top surface of the insulating film 40. For example, as illustrated in FIG. 6, the opening 32 formed in the gate electrode 12 has a depth that starts at the top surface of the insulating film 40.

Since the openings 32-38 and the gate electrodes 11-14 are formed simultaneously by the same semiconductor lithography process, it is not necessary to use a separate lithography process for only forming the openings 32-38. As the above semiconductor lithography process, a photolithography process can be used. The photolithography process is the technique used to transfer a pattern onto a photosensitive resist film by exposing the photosensitive resist film to X-rays through a mask. Alternatively, an EUV lithography or Electron Beam lithography in which a resist film is exposed to EUV (Extreme Ultra Violet) light or an electron beam can be used to transfer a pattern onto the resist film.

After the patterning of the gate electrodes 11-14 and the openings 32-38, dopant impurities are ion-implanted into the active regions 21-24 at an oblique angle relative to the normal line perpendicular to the main surface of the semiconductor substrate 10, using the gate electrodes 11-14 as a mask. For the fabrication of enhancement-mode and depletion-mode p-channel MOSFETs, for example, p-type impurities such as boron ions (its atomic mass number is 11) with the oblique angles of incidence ranging from 30 to 60 degrees (more preferably at about 45 degrees) can be ion-implanted at accelerating voltages ranging from 60 keV to 150 keV. For the fabrication of enhancement-mode and depletion-mode n-channel MOSFETs, n-type impurities such as phosphor ions can be ion-implanted at the oblique angle. During the oblique-angle ion-implantation, the dopant impurities can be ion-implanted at an oblique angle by rotating the semiconductor substrate 1 around its central axis tilted to the direction of an incident ion beam. The angular distribution of the incident ion beams onto the semiconductor substrate 10 is symmetric around the central axis.

Figure 9:
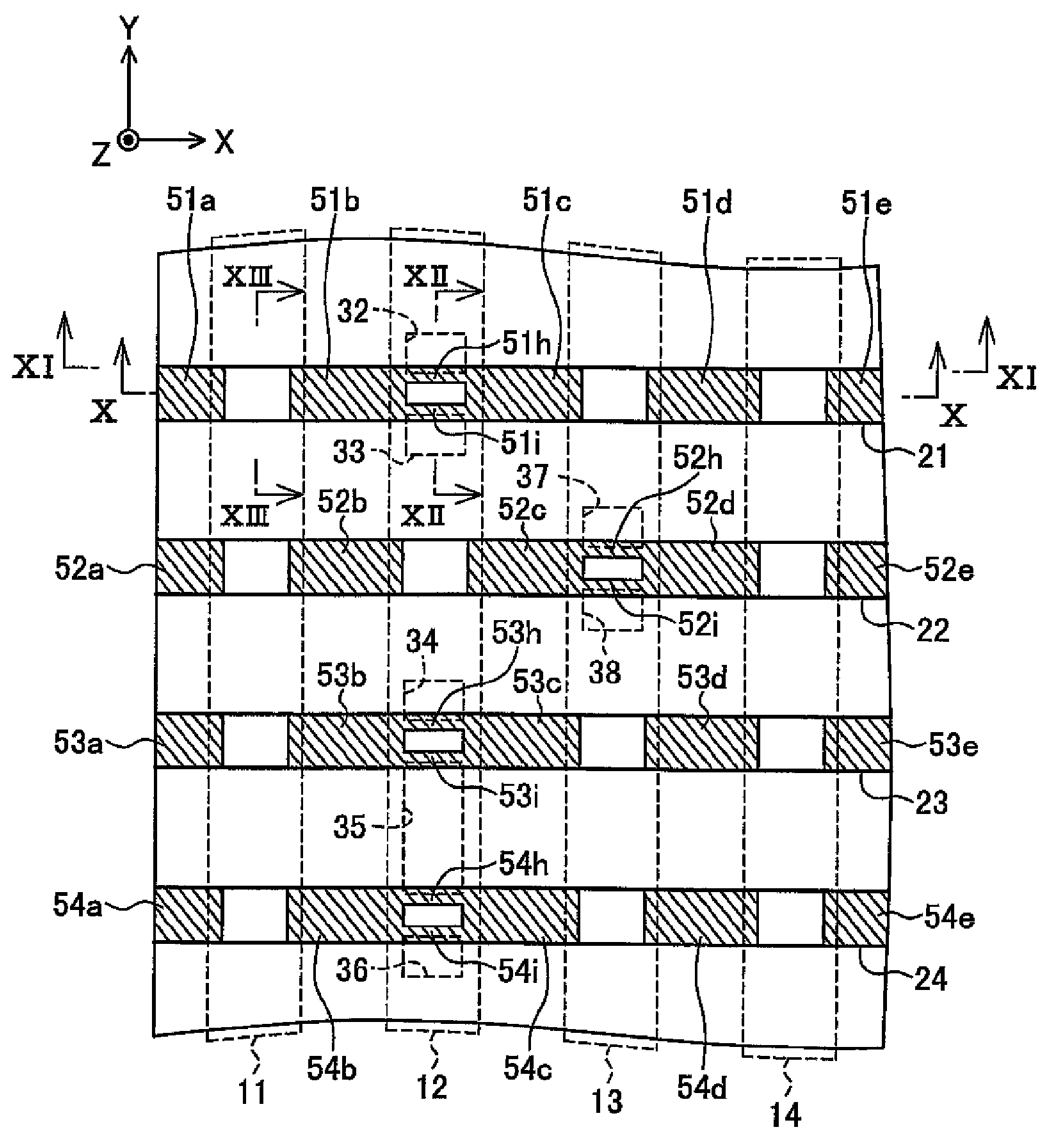
FIG. 9 is a schematic top view of doped regions formed in the active regions by oblique-angle ion-implantation according to the embodiment.
Figure 10:
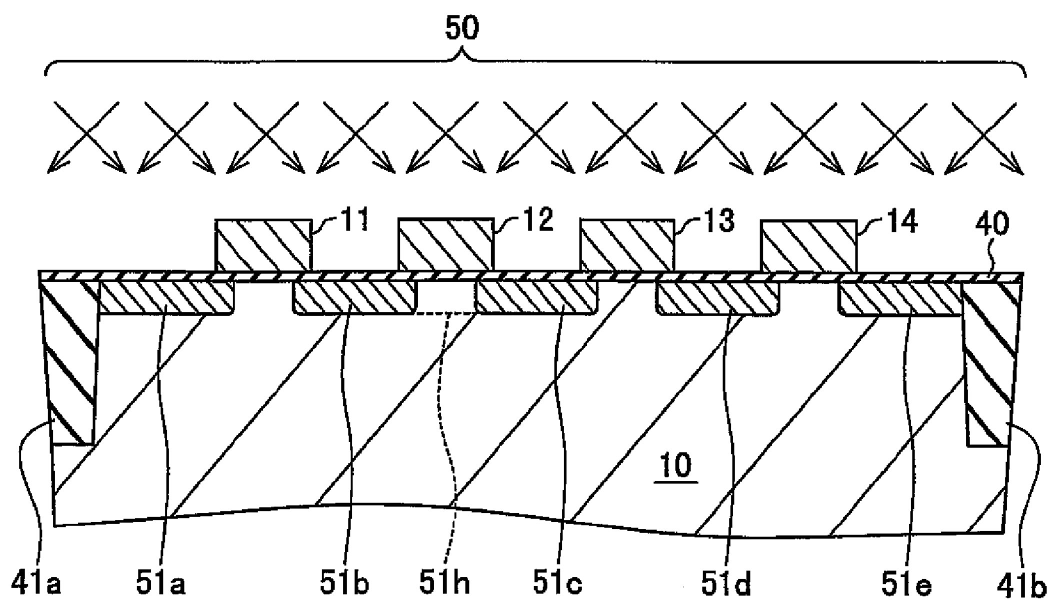
FIG. 10 schematically illustrates a cross-sectional view of the semiconductor structure as taken along line X-X of FIG. 9.
Figure 11:
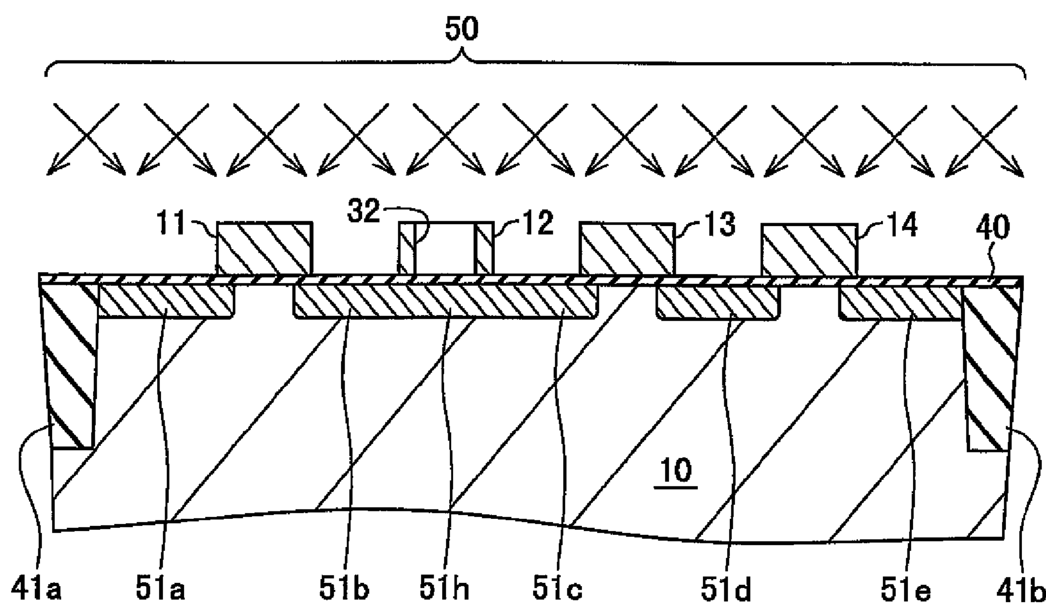
FIG. 11 schematically illustrates a cross-sectional view of the semiconductor structure as taken along line XI-XI of FIG. 9.
Figure 12:
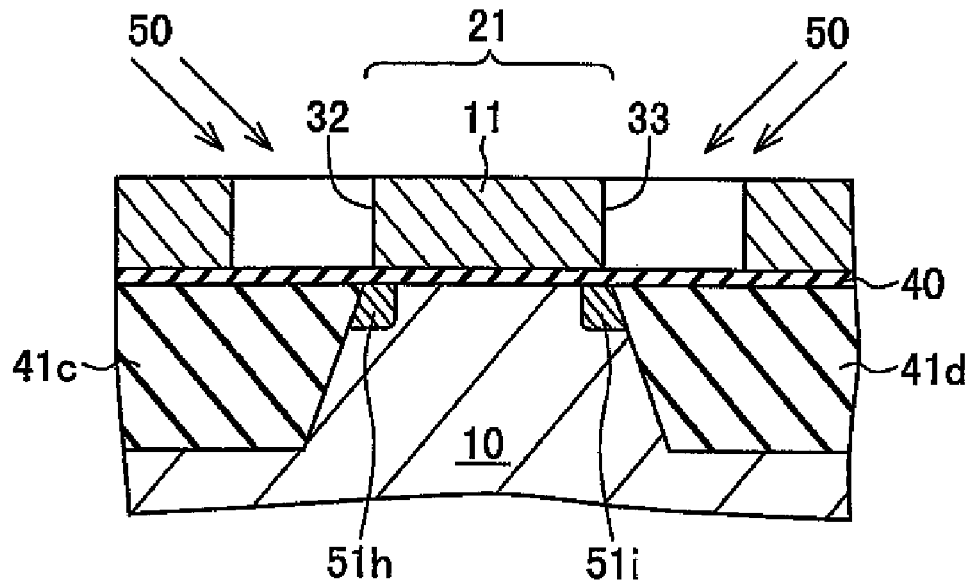
FIG. 12 schematically illustrates a partial cross-sectional view of the semiconductor structure as taken along line XII-XII of FIG. 9.
Figure 13:
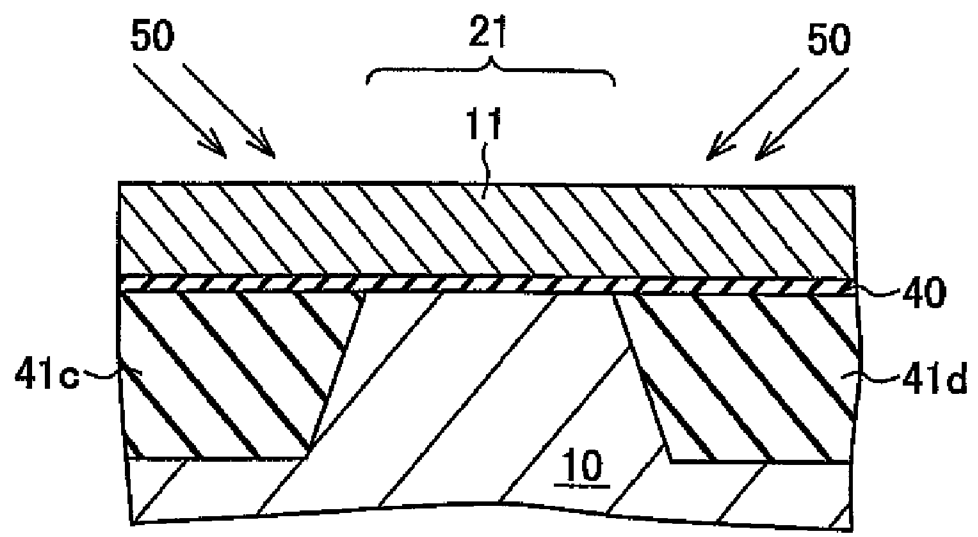
FIG. 13 schematically illustrates a partial cross-sectional view of the semiconductor structure as taken along line XIII-XIII of FIG. 9.

FIGS. 9-13 schematically illustrate cross-sectional views of the semiconductor structure obtained by the oblique angle ion-implantation. FIG. 9 is a schematic top view of doped regions 51*a*-51*e*, 51*h*, 51*i*, 52*a*-52*e*, 52*h*, 52*i*, 53*a*-53*e*, 53*h*, 51*i*, 54*a*-54*e*, 54*h*, 54*i* formed in the active regions 21-24 by the oblique-angle ion-implantation. FIG. 10 schematically illustrates a cross-sectional view of the semiconductor structure as taken along line X-X of FIG. 9. FIG. 11 schematically illustrates a cross-sectional view of the semiconductor structure as taken along line XI-XI of FIG. 9. FIG. 12 schematically illustrates a partial cross-sectional view of the semiconductor structure as taken along line XII-XII of FIG. 9. FIG. 13 schematically illustrates a partial cross-sectional view of the semiconductor structure as taken along line XIII-XIII of FIG. 9.

As illustrated in the cross-sectional view of FIG. 10, impurity ions 50 accelerated at a high voltage are implanted at the oblique angle into the active region 21 through the insulating film 40, on the opposite sides of each of the gate electrodes 11, 12, 13 and 14. As a result, doped regions 51*a*, 51*b* placed in the X-axis direction (i.e., gate-length direction) are formed on the opposite sides of the gate electrode 11; doped regions 51*b*, 51*c* placed in the X-axis direction are formed on the opposite sides of the gate electrode 12; doped regions 51*c*, 51*d* placed in the X-axis direction are formed on the opposite sides of the gate electrode 13; and doped regions 51*d*, 51*e* placed in the X-axis direction are formed on the opposite sides of the gate electrode 14.

Similarly, in the active region 22, doped regions 52*a*, 52*b* placed in the X-axis direction are formed on the opposite sides of the gate electrode 11; doped regions 52*b*, 52*c* placed in the X-axis direction are formed on the opposite sides of the gate electrode 12; doped regions 52*c*, 52*d* placed in the X-axis direction are formed on the opposite sides of the gate electrode 13; and doped regions 52*d*, 52*e* placed in the X-axis direction are formed on the opposite sides of the gate electrode 14. In the active region 23, doped regions 53*a*, 53*b* placed in the X-axis direction are formed on the opposite sides of the gate electrode 11; doped regions 53*b*, 53*c* placed in the X-axis direction are formed on the opposite sides of the gate electrode 12; doped regions 53*c*, 53*d* placed in the X-axis direction are formed on the opposite sides of the gate electrode 13; and doped regions 53*d*, 53*e* placed in the X-axis direction are formed on the opposite sides of the gate electrode 14. In the active region 24, doped regions 54*a*, 54*b* placed in the X-axis direction are formed on the opposite sides of the gate electrode 11; doped regions 54*b*, 54*c* placed in the X-axis direction are formed on the opposite sides of the gate electrode 12; doped regions 54*c*, 54*d* placed in the X-axis direction are formed on the opposite sides of the gate electrode 13; and doped regions 54*d*, 54*e* placed in the X-axis direction are formed on the opposite sides of the gate electrode 14.

These doped regions 51*a*-51*e*, 52*a*-52*e*, 53*a*-53*e* and 54*a*-54*e* will be activated by post thermal treatment to form LDD (Lightly Doped Drain) regions or extension regions. The LDD regions or extension regions can prevent the deterioration of characteristics of the semiconductor device which is due to hot carriers traveling from the source region to the drain region of a FET.

In the active region 21, as illustrated in the cross-sectional views of FIGS. 11 and 12, impurity ions 50 are implanted at an oblique angle into the active region 21 through the openings 32 and 33, thereby forming the doped regions 51*h*, 51*i* below the openings 32 and 33. These doped regions 51*h*, 51*i* as illustrated in FIGS. 9 and 11 continuously extend from one of the opposite sides of the gate electrode 12 to the other along the gate-length direction (i.e., X-axis direction) of the gate electrode 12. Similarly, in the active region 22 below the openings 37 and 38, doped regions 52*h*, 52*i* continuously extend from one of the opposite sides of the gate electrode 13 to the other along the gate-length direction of the gate electrode 13. In the'active region 23 below the openings 34 and 35, doped regions 53*h*, 53*i* continuously extend from one of the opposite sides of the gate electrode 12 to the other along the gate-length direction of the gate electrode 12. In the active region 24 below the openings 35 and 36, doped regions 54*h*, 54*i* continuously extend from one of the opposite sides of the gate electrode 12 to the other along the gate-length direction of the gate electrode 12.

In contrast, in the overlapping regions for enhancement-mode FETs as illustrated in FIGS. 9 and 13, there is no doped region continuously extending from one of the opposite sides of the gate electrode to the other along its gate-length direction.

Figure 14:
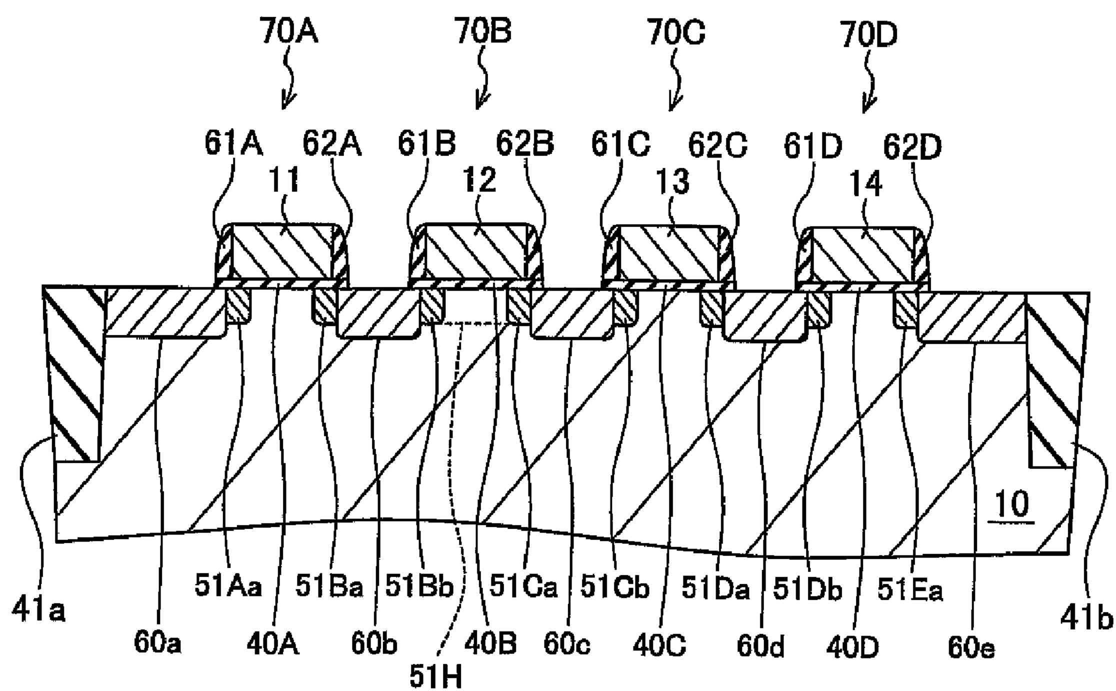
FIG. 14 is a schematic cross-sectional view of a semiconductor structure for explaining a fabrication process of a semiconductor device in the active regions.

After the oblique-angle ion-implantation, source and drain regions will be formed on the opposite sides of each of the gate electrodes 11-14 to be aligned in the gate-length directions, to complete the FETs. A fabrication process after the oblique-angle ion-implantation will be described with reference to FIG. 14. FIG. 14 is a schematic cross-sectional view corresponding to FIG. 10, for explaining the fabrication process in the active region 21.

After the oblique-angle ion-implantation, an insulating dielectric material such as silicon nitride (SiNx) or non-doped silicate glass (NSG) is deposited on the semiconductor structure illustrated in FIG. 10 by, for example, CVD (Chemical Vapor Deposition). The deposited insulating dielectric material is then etched back by anisotropic etching. As a result, as illustrated in FIG. 14, sidewall spacers 61A and 62A are formed on the opposite sidewalls of the gate electrode 11; sidewall spacers 61B and 62B are formed on the opposite sidewalls of the gate electrode 12; sidewall spacers 61C and 62C are formed on the opposite sidewalls of the gate electrode 13; and sidewall spacers 61D and 62D are formed on the opposite sidewalls of the gate electrode 14. In this process for forming the sidewall spacers 61A, 62A, 61B, 62B, 61C, 62C, 61D and 62D, the openings 32-38 are filled with the insulating dielectric material.

Next, dopant impurities, at a sufficiently high concentration, are introduced in the active regions 21-24 on the opposite sides of each gate electrode, using as a mask the sidewall spacers 61A, 62A, 61B, 62B, 61C, 62C, 61D, 62D, the isolation structures 41*a*, 41*b* and the gate electrodes 11-14. The introduced dopant impurities are then activated by thermal treatment such as RTA (Rapid Thermal Annealing). As a result, as illustrated in FIG. 14, source and drain regions 60*a*, 60*b* on the opposite sides of the gate electrode 11, source and drain regions 60*b*, 60*c* on the opposite sides of the gate electrode 12, source and drain regions 60*c*, 60*d* on the opposite sides of the gate electrode 13, and source and drain regions 60*d*, 60*e* on the opposite sides of the gate electrode 14 are formed with a self-aligning process.

At the same time, a pair of LDD regions or extension regions 51Aa, 51Ba is formed below the gate electrode 10B, extending laterally from the source and drain regions 60*a*, 60*b* toward each other; a pair of LDD regions or extension regions 51Bb, 51Ca is formed below the gate electrode 12, extending laterally from the source and drain regions 60*b*, 60*c* toward each other; a pair of LDD regions or extension regions 51Cb, 51Da is formed below the gate electrode 13, extending laterally from the source and drain regions 60*c*, 60*d* toward each other; and a pair of LDD regions or extension regions 51Db, 51Ea is formed below the gate electrode 14, extending laterally from the source and drain regions 60*d*, 60*e* toward each other. These extension regions 51Aa, 51Ba, 51Bb, 51Ca, 51Cb, 51Da, 51Db, 51Ea are obtained by activating the doped regions 51*a*, 51*b*, 51*c*, 51*d*, 51*e* by the above thermal treatment.

Further, the doped regions 51*h*, 51*i*, 52*h*, 52*i*, 53*h*, 53*i*, 54*h*, 54*i* formed in the overlapping regions for depletion-mode FETs are activated by the above thermal treatment, thereby forming the conductive layers. In FIG. 14, the conductive layer 51H formed by the activation of the doped regions 51*h* is illustrated.

By the above-described fabrication process, enhancement-mode FETs 70A, 70C, 70D and a depletion-mode FET 70B are fabricated in and on the active region 21 of the semiconductor substrate 10. Thereafter, an interconnect structure (now shown) is formed over the FETs 70A-70D by fabrication processes including deposition of interlayer dielectric films, formation of contact holes, and formation of interconnect layers, and, finally, a semiconductor device is fabricated.

As described above, the fabrication method according to the embodiment includes the step of forming openings 32-38 in the gate electrodes 12, 13 in the overlapping regions 12Da, 12Db, 12Dc, 13Da for depletion-mode FETs. The fabrication method further includes the step of ion-implanting dopant impurities using the gate electrodes 11-14 as a mask, thereby forming doped regions 51*h*, 51*i*, 52*h*, 52*i*, 53*h*, 53*i*, 54*h*, 54*i* for controlling the threshold voltages of the depletion-mode FETs below the openings 32-38, as well as forming doped regions 51*a*-51*e*, 52*a*-52*e*, 53*a*-53*e*, 54*a*-54*e* for the LDD or extension regions on the opposite sides of the gate electrodes 11-14 in the overlapping regions used for both the depletion-mode FETs and the enhancement-mode FETs. These steps can be used to circumvent the use of lithography and ion-implantation for only forming the doped regions 51*h*, 51*i*, 52*h*, 52*i*, 53*h*, 53*i*, 54*h*, 54*i*. Therefore, the number of fabrication steps for fabricating the depletion-mode and enhancement-mode FETs on a single semiconductor substrate can be reduced compared with conventional fabrication methods, resulting in low cost.

Further, as illustrated in FIG. 9, the openings 32, 33 are located at their respective positions displaced from the center position of the overlapping region along the Y-axis direction. This enables the doped regions 51*h*, 51*i* to be formed near and along the edges of the active region 21 by the ion-implantation. Therefore, it is possible to easily provide the desired characteristics of depletion-mode FETs. This is similar with respect to the other openings 34-38.

The geometrical dimensions of the openings 32-38 can be appropriately designed to control the ion dose distributions of the dozed regions 51*h*, 511, 52*h*, 521, 53*h*, 53*i*, 54*h*, 54*i*. Since the openings 32-38 can be rectangular in shape in the X-Y plane as illustrated in FIG. 9, the ion dose distributions can be controlled by designing the dimension parallel to the X-axis and/or the dimension parallel to the Y-axis.

In the above embodiment, the openings 32, 33 partly overlap the opposite edges of the active region 21 in the Y-axis direction, respectively, no limitation thereto intended. For example, even if each of the openings 32, 33 is placed slightly (e.g., about 1 to 2 micrometers) away from the edge of the active region 21 along the Y-axis direction, the doped regions 51*h*, 51*i* can be formed in the active region 21 by an oblique-angle ion-implantation. This is similar with respect to the other openings 34-38.

The above embodiment can be implemented in a ROM decoder, no limitation thereto intended. The above embodiment also can be implemented in other integrated circuits in which both enhancement-mode FETs and depletion-mode FETs are integrated on a single semiconductor substrate.

The present invention is not limited to the embodiments described above and illustrated in the drawings. For example, in the above embodiments, the active regions 21-24 are four regions, and the gate electrodes 11-14 are four electrodes, no limitation thereto intended. The type of the depletion-mode and enhancement-mode FETs obtained by the above fabrication method may be either n-channel type or p-channel type.

Those skilled in the art will recognize that further variations are possible within the scope of the invention, which is defined in the appended claims.

What is claimed:

1. A method of fabricating a semiconductor device in which enhancement-mode and depletion-mode FETs are integrated on a semiconductor substrate, said method comprising:

forming a plurality of active regions in a semiconductor substrate, the active regions being located at a main surface of the semiconductor substrate and electrically separated from one another by an isolation structure;

forming a plurality of gate electrodes on the plurality of active regions, each gate electrode extending in an extending direction transverse to the plurality of active regions;

forming an opening in a gate electrode for the depletion-mode FET of the plurality of gate electrodes, the opening being located in or in the vicinity of one of overlapping regions in which the gate electrodes extend over the active regions;

ion-implanting dopant impurities into the active regions at an oblique angle of incidence relative to a normal line perpendicular to the main surface of the semiconductor substrate, using the gate electrodes as a mask, thereby to form first, second and third doped regions simultaneously in the active regions, the first and second doped regions being located on respective opposite sides of each of the gate electrodes along a gate-length direction of a corresponding one of the gate electrodes, and third doped region being located below the opening and continuously extending from one of the opposite sides of a corresponding one of the gate electrodes to the other; and forming source and drain regions in the active regions, the source and drain regions being located on the respective opposite sides of each of the gate electrodes.

2. The method of claim 1, wherein said forming a plurality of gate electrodes and said forming an opening are performed simultaneously by a same semiconductor lithography process.

3. The method of claim 2, wherein the opening is located at a position displaced from a center position of a corresponding one of the overlapping regions along said extending direction.

4. The method of claim 3, wherein the opening is located directly over each of opposed edges of the corresponding one of the overlapping regions.

5. The method of claim 1, wherein the dopant impurities are ion-implanted at an oblique angle ranging from 30 to 60 degrees relative to the normal line.

6. The method of claim 5, wherein the oblique angle is approximately 45 degrees.

7. The method of claim 1, further comprising forming a pair of sidewall spacers adjacent to the opposite sides of each of the gate electrodes by ion-implanting dopant impurities into the active regions using both the gate electrodes and the sidewall spacers as a mask.

* * * * *